CRYSTAL OSCILLATOR APPARATUS

Filed Aug. 3, 1954 2 Sheets-Sheet 1

INVENTOR
E. P. FELCH
BY
W. J. O'Neill
ATTORNEY

INVENTOR
E. P. FELCH
BY W. J. O'Neill
ATTORNEY

United States Patent Office 2,775,699

Patented Dec. 25, 1956

2,775,699

CRYSTAL OSCILLATOR APPARATUS

Edwin P. Felch, Chatham, N. J., assignor to Bell Telephone Laboratories, Incorporated, New York, N. Y., a corporation of New York Application August 3, 1954, Serial No. 447,581

9 Claims. (Cl. 250—36)

This invention relates to oscillator apparatus, and particularly to crystal oscillator apparatus which may be utilized as a frequency standard, for example, and for other purposes.

One of the objects of this invention is to suppress spurious oscillations in crystal oscillators.

Another object of this invention is to suppress undesired oscillations in crystal oscillators without interference with the desired mode of oscillation.

Another object of this invention is to provide simple means for suppressing undesired oscillations in crystal oscillators.

Another object of this invention is to provide oscillator apparatus capable of high precision in frequency stability and accuracy.

Another object is to provide crystal oscillator apparatus capable of operation at high frequencies by utilizing crystal overtones.

Another object is to provide simple means for stabilizing the frequency of an electrical oscillating circuit at a selected overtone frequency of a piezoelectric resonator.

Another object is to obtain improved frequency stability by insuring oscillation of a crystal oscillator at an overtone rather than the fundamental frequency of the crystal.

For control of the frequency of an oscillation generator, it is desirable to utilize a piezoelectric body for controlling the desired frequency of oscillations. For this purpose, a stable piezoelectric crystal body may be utilized and, in a suitable circuit, the crystal may be operated at or near a desired resonant mode frequency thereof. The selected crystal mode frequency may be, for example, a desired odd order mechanical harmonic or overtone mode frequency of the fundamental shear mode thickness vibration of a known suitable AT-cut or BT-cut quartz crystal element, for example; and in a suitable circuit, such a crystal element may be operated at or near the desired series-resonant mode frequency thereof and the unwanted mode frequencies thereof may be suppressed by suitable circuit means.

A crystal oscillator employing an overtone or harmonic mode piezoelectric crystal usually employs some means for preventing spurious oscillations, particularly at the unwanted fundamental mode of motion of the crystal. Although several methods are available in the prior art, such methods often make use of reactive elements, and thus tend to degrade the performance of the oscillator.

In accordance with a feature of this invention, means of a non-reactance character may be provided for suppressing undesired spurious oscillations in crystal oscillators, without causing any substantial impairment of the oscillator performance. For this purpose, a resistor of suitable resistance value may be provided in parallel with the crystal and the crystal frequency-adjusting reactor or reactors; and the addition of such a suppressor resistor to the oscillator circuit, while providing effective suppression of unwanted modes of operation, does not cause potential instability, such as may be the case when reactive elements are used or added in parallel with the crystal. Such reactive elements, because of their inherent instability, are not capable of providing the high degree of frequency stability and accuracy that may be achieved when only a shunting resistor of suitable resistance is added and utilized in accordance with a feature of the present invention.

For a clearer understanding of the nature of this invention and the additional advantages, features and objects thereof, reference is made to the following description taken in connection with the accompanying drawings, in which like reference characters represent like or similar parts and in which:

Fig. 1 is a schematic circuit diagram illustrating crystal oscillator apparatus in accordance with this invention;

Figs. 1A, 1B and 1C are schematic circuit diagrams illustrating various modifications which may be used for the crystal network branch between points A and B of the oscillator V1 of Fig. 1; Fig. 1A showing the crystal network branch between A and B as comprising the crystal only; Fig. 1B as comprising the crystal and a series frequency-adjusting inductance $L_A$; and Fig. 1C as comprising the crystal and series frequency-adjusting reactors comprising an inductance $L_A$ and a capacitance $C_A$;

Figures 1, 1A, 1B, 1C:
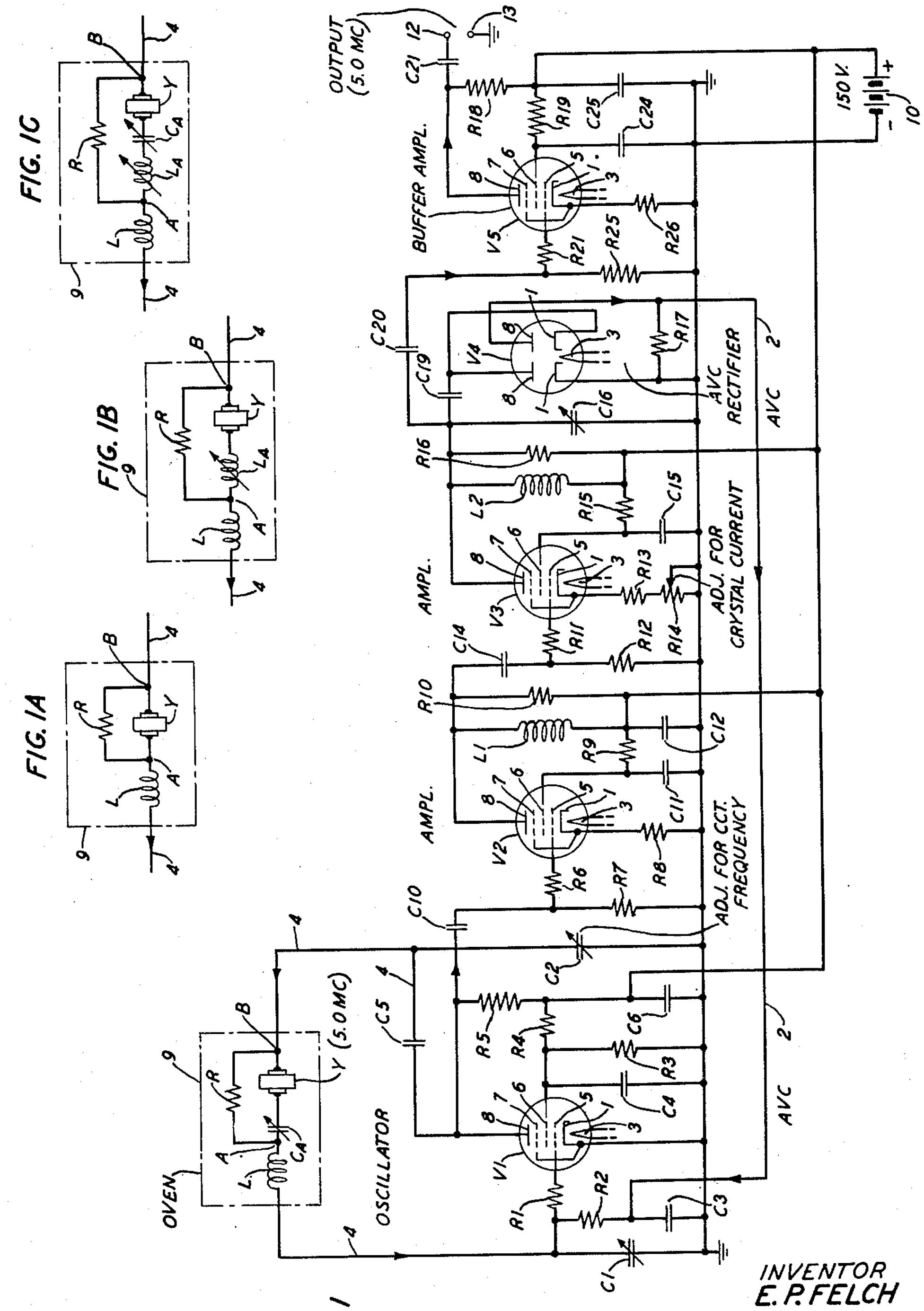

Referring to the drawing, Fig. 1 is a schematic circuit diagram illustrating crystal oscillator apparatus comprising generally a series-resonant type overtone crystal oscillator V1 followed by a two-stage tuned amplified V2 and V3 which may be utilized to increase the amplitude level sufficiently to obtain adequate AVC action, a rectifier V4 which may be utilized to provide a suitable bias potential for the oscillator tube V1, and another amplifier V5 which may act as a buffer connected to the output terminals 12 and 13. The output terminals 12 and 13 may be utilized to supply oscillations to a frequency divider, or to other desired output circuit.

As shown in Fig. 1, the harmonic or overtone crystal oscillator V1 may comprise per se a modified Pierce type crystal oscillator circuit comprising generally, a suitable source of gain which may be in the form of a single pentode type vacuum tube V1, a tuned circuit which may comprise an input grid circuit condenser C1, a plate output circuit condenser C2 and a feedback path series inductor L adapted to resonate substantially at or near the desired operating frequency corresponding to the desired mechanical harmonic or overtone mode frequency of the feedback path series-resonant type piezoelectric crystal Y, and a suppressor resistor R of suitable resistance value added across the crystal network terminals A and B to suppress oscillations at the unwanted overtone and fundamental mode frequencies of the piezoelectric Y without interference with the desired overtone mode frequency oscillations thereof. As shown in Fig. 1, a series reactor in the form of a capacitor $C_A$ may be utilized to adjust the frequency. Other forms of series-connected frequency-adjusting reactors that may be utilized are illustrated in Figs. 1B and 1C. In cases where no frequency-adjusting reactor or reactors are needed, the crystal Y may be used alone as illustrated in Fig. 1A.

As particularly shown in Fig. 1, the gain source may comprise a single pentode V1 having a grounded cathode electrode 1 heated by a suitable cathode heater 3 which may be energized by a battery or other suitable power supply source (not shown); an input or control grid electrode 5 which may be connected through a grid series resistor R1 to the grid condenser C1 and to the oscillator feedback path 4, and which also may be connected through a suitable grid leak resistor R2 and condenser C3 to the grounded cathode 1 and through a point intermediate the resistor R2 and the condenser C3 to an automatic volume control (AVC) circuit 2 for receiving therefrom a suitable negative bias potential from the plate output 8 of the AVC rectifier tube V4; a screen grid electrode 6 of oscillator tube V1 which may be connected through a condenser C4 and a resistor R3 to ground and through a resistor R4 to the positive (+) terminal of a suitable source of power supply voltage 10; a suppressor grid electrode 7 which may be connected with the grounded cathode electrode 1; and an anode or plate output electrode 8 which may be energized with a suitable positive (+) potential through a suitable resistor R5 by means of the power supply source 10 connected to a point intermediate the resistor R5 and the condenser C6. The plate electrode 8 of the oscillator tube V1 as shown in Fig. 1 may be connected through a suitable coupling condenser C5 to the plate circuit tuning condenser C2 and also with the oscillator feedback circuit 4 which comprises the frequency-controlling piezoelectric crystal Y and its associated frequency-adjusting capacitor $C_A$ both shunted by the suppressor resistor R and connected in series with the tuning circuit inductor L.

As shown in Fig. 1, the plate electrode 8 of the tube V1 together with the cathode and control grid electrodes 1 and 5 thereof constitute the oscillation generating electrodes of the oscillator tube V1. The grid and plate circuit shunt condensers C1 and C2 thereof resonate the series inductor L at or near the desired operating frequency which is controlled by the desired series-resonant mode overtone frequency of the piezoelectric crystal Y and which may be adjusted slightly by means of the capacitor $C_A$ disposed in series therewith. Output oscillations may be taken off from the plate electrode 8 of the oscillator tube V1 through a suitable coupling condenser C10 and from there supplied to the amplifier and rectifier circuit V2, V3, V4, or to another type of output system if desired.

As illustrated in Fig. 1, the frequency-controlling crystal network comprises the overtone piezoelectric crystal Y and its associated frequency-adjusting reactor $C_A$, and may be connected as shown in the feedback path 4 which extends between the plate and control grid electrodes 8 and 5 respectively of the oscillator tube V1; and the associated tuned circuit therefor comprises the series inductor L and the grid and plate circuit shunt condensers C1 and C2 which may be tuned approximately to the desired overtone mode frequency of the crystal Y. The oscillator inductance L may be mounted in a suitable temperature regulated oven 9, together with the crystal Y, the crystal frequency-adjusting capacitor $C_A$ and the suppressor resistor R. The plate circuit capacitor C2 may be variable and used to tune the oscillator circuit to approximately the desired operating frequency with the crystal Y and the crystal-adjusting capacitor $C_A$ shorted. A gain control R14 may be provided on the amplifier V3 to provide a suitable adjustment in gain corresponding to a desired current through the crystal Y.

In order to maintain a high degree of frequency accuracy, the crystal Y may be operated in an oven 9 which is capable of holding it within close temperature limits; and the current through the crystal Y may be held substantially constant, as within 1 decibel (db), by means of the AVC system comprising the amplifiers V2, V3, the rectifier V4 and the circuit 2. Since the crystal Y, in some cases, cannot per se be manufactured to an exact desired frequency, frequency-adjustment means in the form of the series capacitor $C_A$, or other suitable series reactor or reactors as shown in Figs. 1B and 1C, may be provided. This adjustment may also be made adequate to cover limited frequency changes due to aging of the crystal Y.

The harmonic or overtone mode crystal body Y for the crystal oscillator V1 of Fig. 1 may be any suitable series-resonant type of piezoelectric crystal body adapted to operate at or near a mechanical harmonic mode overtone frequency of its fundamental mode frequency. As an example, a thickness-shear mode AT-cut or BT-cut quartz crystal element operating and working at or near an odd order overtone of its fundamental thickness shear mode of motion may be conveniently utilized, and the desired overtone mode frequency thereof may be the third, fifth, seventh, or other odd order overtone mode frequency thereof corresponding to the frequency desired for the circuit oscillations.

Examples of such AT-cut or BT-cut quartz crystals are disclosed, for example, in United States Patent No. 2,218,200, issued October 15, 1940, to Lack, Willard and Fair; also in an article by A. W. Warner, Jr., entitled "High frequency crystal units for primary frequency standards," published in I. R. E. Proceedings of September 1952. The latter crystal unit comprises a wire-mounted plano-convex AT-cut thickness-shear mode quartz crystal which may be operated for example on the fifth overtone of the fundamental mode frequency thereof, and which may be conveniently used as the crystal unit Y of the crystal oscillator V1 of Fig. 1.

Figure 2:
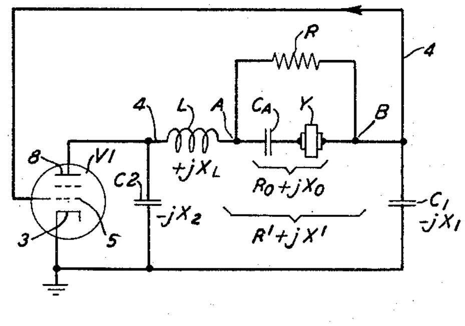
Fig. 2 is a basic or simplified circuit diagram of the crystal oscillator V1 of Fig. 1, and may be conveniently used for explaining the theory or principle of operation of the crystal oscillator V1 provided with the suppressor resistor R.

The use of an overtone mode crystal Y in the crystal oscillator V1 of Figs. 1 and 2 requires suppression of oscillations at unwanted frequencies. In this particular oscillator, the desired operation is, as an example, taken to be at or near the fifth overtone of the AT-cut quartz crystal Y. To prevent undesired oscillations at the unwanted frequencies, particularly at the fundamental mode and the third overtone mode frequencies of the crystal Y, the suppressor resistor R of suitable resistance value is added in parallel with the crystal Y and its associated frequency-adjusting capacitor $C_A$. This added resistor R effectively suppresses oscillation at any crystal frequency except the desired fifth overtone (5 mc.) frequency of the crystal Y, without causing any substantial adverse effects on the circuit.

Accordingly, in accordance with a feature of this invention, the suppressor resistor R, added across points A and B in parallel circuit relation with the overtone crystal Y, may be utilized to prevent circuit oscillations at the undesired fundamental and undesired overtone mode frequencies of the crystal body Y, while at the same time permitting oscillations at the desired overtone mode frequency thereof. For this purpose, the suppressor resistor R may be made of a suitable resistance value which, though not a highly critical value, is of sufficiently low resistance value to suppress the undesired fundamental and undesired overtone mode oscillations and at the same time of sufficiently high resistance value to permit the desired overtone series-resonant mode frequency oscillations.

A point of interest is that the suppressor resistance R of suitable resistance value may be utilized to suppress oscillations at all resonances, fundamental and overtone, of the crystal body Y other than the desired overtone series resonance mode thereof; and also that it may be utilized to do so without any substantial interference with the desired overtone resonance oscillation of the crystal body Y. Also, it will be noted that the shunting resistor R being relatively large in resistance value as compared to the resistance value of the crystal Y at its desired operating series-resonant frequency, does not interfere with the latter. While the resistor R in being used to suppress unwanted modes of oscillation may cause a slight decrease in the action of the crystal Y, this effect may be approximately cancelled by the increase in action thereof caused by the capacitance effect of the crystal Y when operating in a positive reactance condition above the crystal resonant frequency. Another point of interest is that the use of the suppressor resistor R to suppress unwanted oscillations permits the use of a simple type of crystal oscillator circuit with conventional components and at the same time effectively suppresses the unwanted crystal mode oscillations without interference with the desired overtone crystal mode oscillations.

Figure 3:
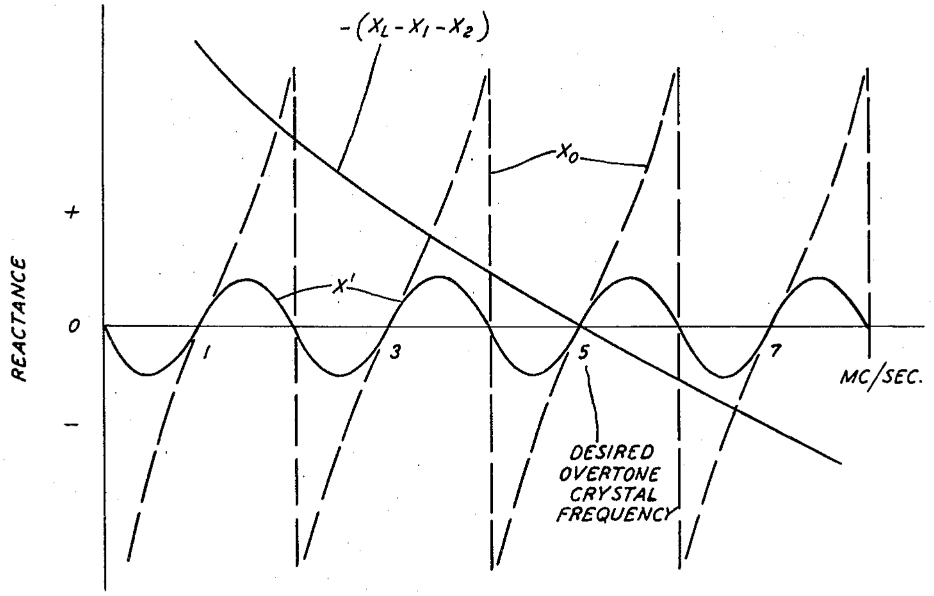
Fig. 3 is a graph illustrating characteristic reactance-frequency curves and relations for the crystal oscillator V1 of Figs. 1 and 2 provided with the suppressor resistor R.

The theory or principle of operation of the suppressor resistor R of Fig. 1 may be explained and illustrated in connection with Figs. 2 and 3. Fig. 2 shows a basic simplified circuit diagram of the crystal oscillator V1 of Fig. 1; and Fig. 3 shows characteristic reactance-frequency curves pertaining thereto—for operation on or near the desired selected fifth overtone resonance frequency of the crystal Y which in the particular example illustrated in Figs. 1, 2 and 3 corresponds to 5 megacycles per second (5 mc.). The mathematical symbols used in Figs. 2 and 3 have their usual significance; R, $R_0$, R′ representing resistance; $X_0$, X′, $X_1$, $X_2$ reactance; and $j$ the usual 90 degree vector displacement.

As illustrated in Fig. 2, the simplified crystal oscillator circuit shown therein corresponds to that shown at V1 in Fig. 1 and comprises basically the electronic source of gain V1 having an input grid-cathode circuit capacitance $C_1$ of reactance $-jX_1$; an output anode or plate-cathode circuit capacitance $C_2$ of reactance $-jX_2$; and a feedback path 4 comprising series inductance L of reactance $+jK_L$ and a series combination comprising crystal frequency-adjusting series capacitance $C_A$ in series with the crystal Y, this series combination having an impedance of $R_0+jX_0$ and being shunted by a resistance R, the impedance across the terminal points A and B being given by the expression $R'+jX'$, and the condition for oscillation for the crystal oscillator of Fig. 2 being given by the expression $X_L-X_1-X_2+X'=0$.

The circuit of Fig. 2 is such that if a short circuit be placed between points A and B of Fig. 2, oscillation will occur at or near the desired frequency (5 mc.) as determined by the values of the remaining circuit components comprising series inductance L, grid capacitance $C_1$ and plate capacitance $C_2$, or more particularly, as determined by the reactance equation $X_L-X_1-X_2=0$. Now, if the short circuit just referred to between points A and B be removed, the operation of the oscillator may be considered with the elements introduced into the circuit comprising the crystal Y, the crystal frequency-adjusting reactance $C_A$, and the shunting resistance R. The reactance element $C_A$ (or $C_A$ and $L_A$ of Figs. 1B and 1C if $L_A$ is used) are made of suitable values to cancel the reactance component of the crystal impedance at the desired frequency of operation, so that reactance $X_0=0$ and the crystal Y operates at or near its fifth overtone series resonant frequency. The resistance of the crystal Y and its associated frequency adjusting reactance element $C_A$ is denoted by $R_0$. The operation of the oscillator is considered below, first without using the shunting resistance R, and then with the shunting resistor R of Fig. 2 added.

Considering first the circuit of Fig. 2 with the shunting resistor R removed, the reactance of the crystal branch, which comprises the crystal Y and the reactance $C_A$ as shown in Fig. 2, is $X_0$, and the new condition for oscillation with the crystal Y added is that the reactance $X_L-X_1-X_2+X_0=0$. Since the reactance $X_0$ is adjusted to zero at the desired frequency of oscillation, this frequency remains unchanged. However, at other frequencies the reactance $X_0$ will not be zero, and will exhibit a reactance characteristic as shown by the dash labeled $X_0$ in Fig. 3. Also, in Fig. 3, there is plotted the negative of the value of $X_L-X_1-X_2$ which is shown in Fig. 3 by the curve labeled—$(X_L-X_1-X_2)$. Wherever these curves $X_0$ and $-(X_L-X_1-X_2)$ of Fig. 3 cross, the condition for oscillation is met since the total reactance is zero, and accordingly, it is apparent that in the absence of the shunting resistance R, oscillation is possible not only at or near the desired fifth overtone frequency at 5, but also at or near the other odd order overtone frequencies at 1, 3, 7 of the crystal Y. Since the present AT-cut crystal Y does not function at even order overtones 2, 4, 6 etc., the even order overtone resonances are omitted from Fig. 3.

Now considering the oscillator circuit of Fig. 2 with the shunting resistor R added, the reactance between points A and B of Fig. 2 is altered, and is shown on the sketch in Figs. 2 and 3 as X′. The maximum value of X′ is determined by the value of the shunt resistance R. In the case shown, with a suitable resistance value selected for the shunt resistance R, there is only one frequency at which the condition for oscillation is met, and that frequency is the desired frequency of oscillations. Hence all other and unwanted frequencies are suppressed by a suitable resistance value for the suppressor resistor R.

The required resistance value R may be determined experimentally; also, it may be determined mathematically, using the following equations for the crystal oscillator V1 provided with the suppressor resistance R:

$$R'=R\times\frac{R_0(R+R_0)+X_0^2}{(R+R_0)^2+X_0^2} \qquad (1)$$

$$X'=R^2\times\frac{X_0}{(R+R_0)^2+X_0^2} \qquad (2)$$

For $X_0=0$, Equation 1 becomes:

$$R'=R_0\times\frac{R}{R+R_0} \qquad (3)$$

The derivative of X′ (Equation 2) with respect to $X_0$ is:

$$\frac{dX'}{dX_0}=R^2\times\frac{(R+R_0)^2-X_0^2}{[(R+R_0)^2+X_0^2]^2} \qquad (4)$$

For $X_0=0$, Equation 4 becomes:

$$\frac{dX'}{dX_0}=\frac{R^2}{(R+R_0)^2}=\frac{1}{(1+R_0/R)^2} \qquad (5)$$

Set $$\frac{dX'}{dX_0}$$

in Equation 4 equal to 0, and solve for $X_0$:

$$X_0=\pm(R+R_0)\text{ for }|X'|\text{ max.} \qquad (6)$$

Combining Equation 2 and Equation 6, $$|X'|\text{ max.}=\frac{R^2}{2(R+R_0)}\approx\frac{R}{2} \qquad (7)$$

Expressions for R′ and X′ are given above in Equation 1 and Equation 2. Taking the derivative of X′ with respect to $X_0$, Equation 4 is obtained; and setting this derivative equal to zero and solving for $X_0$ gives the value of $X_0$ when X′ is maximum, as shown in Equation 6. Since X′ maximum must be less than $X_L-X_1-X_2$, we find from Equation 7 that R must be less than 2X′, that is, less than $2(X_L-X_1-X_2)$ at any undesired frequency. Thus, the required value for resistance R is determined by the circuit constants L, C1, C2, and those of the crystal branch between points A and B of Fig. 2.

It will be noted that the addition of the resistance R of suitable value across the crystal branch AB of Fig. 2 has only a small effect on the operation at the desired frequency. As to the effect of the added resistor R on the resistance of the crystal circuit between points A and B of Fig. 2, Equation 3 shows that when $X_0=0$, the resistance R is smaller than resistance $R_0$ by the factor $R/(R+R_o)$. Since in general, resistance R will be substantially greater than resistance $R_o$, the resistance of the crystal circuit is essentially unchanged by the addition of the resistance R in parallel across the crystal circuit AB. As to the effect of the added resistance R on the reactance of the crystal circuit between points A and B of Fig. 2, Equation 5 shows that the derivative of X' with respect to $X_o$ when $X_o=0$ is a function of $R_o$/R, wherein in general, resistance R being substantially greater than resistance $R_o$ the effect of the added resistance R on the reactance of the crystal circuit AB is small. Taking a numerical example, assume that $R_o=150$ ohms and $R=2000$ ohms. Then the derivative referred to is equal to 0.865, and hence, the slope of the reactance component has been diminished only by about 1 decibel (db), a negligible amount.

Figure 4:
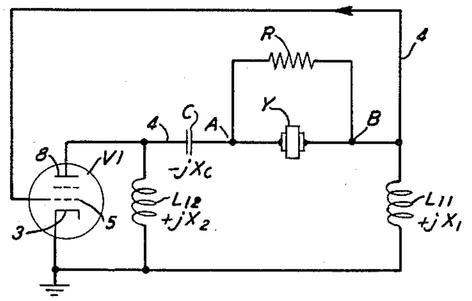
Fig. 4 is a simplified circuit diagram illustrating a modification of the oscillator circuit shown in Fig. 2.

Fig. 4 is a simplified circuit diagram somewhat similar to that shown in Fig. 2 but employing, as the resonant or tuning circuit means thereof, a series capacitance C and shunt inductances L11 and L12, instead of the series inductance L and shunt capacitances C1 and C2 shown in Fig. 2. More particularly, the series inductance L of Fig. 2 may be changed to a series capacitance C of equal but opposite reactance $-jX_c$ as shown in Fig. 4, the shunt capacitances C1 and C2 of Fig. 2 being correspondingly changed to shunt inductances L11 and L12 of equal but opposite reactances $+jX_1$ and $+jX_2$ respectively as shown in Fig. 4. These changes will not affect the function of the suppressor resistance R nor the theory of operation of the circuit, as described above, except insofar as the signs of the reactances are concerned.

From the above, it will be noted that the addition of a suppressor resistor R of suitable resistance value in parallel with the crystal branch AB of the circuit of Figs. 1, 2 and 4 results in preventing spurious oscillation at unwanted mode frequencies of the crystal Y without causing any pronounced adverse effect on the circuit operation at the selected frequency of the crystal Y.

While the suppressor resistor R has been described and illustrated expressly in connection with a particular fifth overtone crystal Y employed in an oscillator circuit as shown at V1, it will be understood that it may be utilized to suppress spurious oscillations in other types of crystal oscillator circuits employing other series resonant type piezoelectric crystals operating at or near a desired resonant mode frequency thereof.

Referring back to Fig. 1, the desired crystal controlled oscillations generated by the oscillator V1 may be taken off from the cathode and plate electrodes 1 and 8 of the oscillator tube V1, and applied through the coupling condenser C10 to the AVC amplifiers V2 and V3 and rectifier V4.

As particularly shown in Fig. 1, the AVC circuit comprises the two-stage amplifier V2, V3, the rectifier V4 and the circuit 2 as provided between the plate output 8 and the control grid input 5 of the oscillator tube V1. This AVC circuit may be utilized to maintain the current through the crystal Y at a substantially constant value, such as for example, within about 1 decibel (db) at a level in the neighborhood of about 50 microamperes current. With this value of current, the alternating current voltages of the oscillator tube V1 may be, for example, approximately 6 millivolts at the grid 5 and 20 millivolts at the plate 8. Simultaneously, the oscillator tube V1 may be provided with a suitable bias potential on the control grid 5 thereof, as of about −2 volts or other suitable value, to operate at the required transconductance, for example of approximately 3000 micromhos, for unity gain. This bias potential, as well as the constant crystal current referred to, is provided in Fig. 1 by the two-stage amplifier V2, V3 and rectifier V4 having its negative (−) output from plate 8 connected through the circuit 2 to the control grid 5 of oscillator tube V1.

As an illustrative example in a particular case for a particular oscillator constructed in accordance with the circuit of Fig. 1 and adapted for generating output oscillations having in the case of the present illustrative example the desired frequency of 5 megacycles per second as controlled by an AT-cut quartz piezoelectric crystal Y operating at or near its fifth overtone thickness shear mode frequency of 5 megacycles per second, the circuit components of Fig. 1 may comprise elements as follows. The oscillator tube V1, the amplifier tubes V2 and V3 and the buffer amplifier tube V5 may each comprise a conventional type 6AK5 pentode type vacuum tube. The rectifier tube V4 may comprise a known 6AL5 double rectifier tube. The power supply source 10 may be a suitable source of about 150 volts direct-current potential, or other appropriate value. The component circuit resistors, condensers, and inductors for the five megacycle crystal oscillator V1 may have values approximately as follows: series inductor L about 16.6 microhenries; condensers C1 and C2 theoretically about 244 and 82 micromicrofarads respectively or other values sufficient to resonate the series inductor L at the desired frequency of 5 megacycles per second, it being understood that the actual capacitances of C1 and C2 may be somewhat less to take account of the total capacitances in the associated circuits; crystal frequency-adjusting capacitor $C_A$ about 5 to 80 micromicrofarads or other range to suit the crystal Y; suppressor resistor R about 2200 ohms or other resistance value sufficient to suit the crystal Y and suppress oscillations at the undesired fundamental and third harmonic mode frequencies thereof while at the same time permitting oscillations at the desired fifth overtone mode frequency thereof which in the present illustrative example is 5.0 megacycles per second; condensers C3 and C4 and C6 about 1000 micromicrofarads each; coupling condensers C5 and C10 about 10 micromicrofarads each; resistor R1 about 33 ohms, R2 about 100,000 ohms, R3 about 27,000 ohms, R4 about 10,000 ohms, R5 about 10,000 ohms.

In the case of the present illustrative example, the output of the 5 megacycle crystal oscillator V1 is applied to the amplifiers V2 and V3 and the rectifier V4, and the component resistors, condensers and inductors thereof may have values approximately as follows: as to the amplifier V2-grid resistor R6 about 33 ohms; resistor R7 about 100,000 ohms; cathode resistor R8 about 330 ohms; screen grid resistor R9 about 10,000 ohms; plate resistor R10 about 5100 ohms; condensers C11, C12 and C14 about 1000 micromicrofarads each; inductor L1 about 37 microhenries. As to the tuned amplifier V3-grid resistor R11 about 33 ohms; resistor R12 about 100,000 ohms; cathode resistor R13 about 150 ohms; cathode resistor R14 for adjusting crystal Y current about 0 to 500 ohms or other suitable range; screen resistor R15 about 22,000 ohms; plate resistor R16 about 5,100 ohms; blocking condenser C15 about 1000 micromicrofarads; tuning condenser C16 about 1 to 11 micromicrofarads or other suitable range; inductor L2 about 37 microhenries. As to rectifier V4-coupling condenser C19 about 1000 micromicrofarads; resistor R17 about 100,000 ohms. As to buffer amplifier V5-coupling condenser C20 about 100 micromicrofarads; grid resistor R21 about 33 ohms; resistor R25 about 100,000 ohms; cathode resistor R26 about 220 ohms; screen resistor R19 about 10,000 ohms; plate resistor R18 about 2200 ohms; condensers C24 and C25 about 1000 micromicrofarads each; output coupling condenser C21 about 2 micromicrofarads or other suitable value.

Although this invention has been described and illustrated in relation to specific arrangements, it is to be understood that it is capable of application in other organizations and is therefore not to be limited to the particular embodiments disclosed.

What is claimed is:

1. Crystal oscillator apparatus comprising a source of gain having input and output circuits comprising shunt reactors, a feedback circuit coupling said output circuit with said input circuit and comprising a series reactor connected in series with a frequency-controlling crystal network, said crystal network comprising a series-resonant type overtone mode frequency piezoelectric crystal body, said series reactor and said shunt reactors being tuned to resonate substantially at said desired overtone mode operating frequency of said crystal body, said crystal network being substantially resistive and non-reactive at said operating frequency, and means comprising a resistor connected directly across in parallel circuit relation with said crystal network and having a resistance value sufficiently small for suppressing spurious oscillations at the undesired fundamental mode frequency and frequencies of said crystal body lower in frequency than said operating frequency and simultaneously sufficiently large with respect to the series-resonant resistance of said crystal network at said operating frequency for permitting desired oscillations substantially at said desired operating overtone mode frequency thereof.

2. Crystal oscillator apparatus in accordance with claim 1, and means including a rectifier responsive to the amplitude of oscillations received from said output circuit and connected with said input circuit of said source of gain for maintaining the magnitude of the current through said crystal body at a substantially constant level.

3. Crystal oscillator apparatus comprising an electronic source of gain having grid input and anode output circuits each comprising a shunt reactor, a feedback circuit connected in parallel circuit relation across said input and output circuit reactors and coupling said output circuit with said input circuit and comprising a series reactor connected in series with a frequency-controlling crystal network, said crystal network comprising a frequency-adjusting reactance means connected in series with a series-resonant type overtone mode frequency piezoelectric crystal body, said shunt reactors and said series reactor being tuned to resonate substantially at said desired overtone mode operating frequency of said crystal body, said crystal network being substantially resistive and non-reactive at said operating frequency, and means comprising a resistor connected directly across in parallel circuit relation with said crystal network and having a resistance value sufficiently small for suppressing unwanted oscillations at resonant mode frequencies of said crystal body lower in frequency than said desired operating overtone mode frequency thereof, said resistance value being simultaneously sufficiently large with respect to the series-resonant resistance of said crystal network at said operating frequency for permitting the desired oscillations substantially at said desired operating overtone mode frequency of said crystal body.

4. Crystal oscillator apparatus in accordance with claim 3, and means comprising amplifier and rectifier apparatus connected between said anode output and grid input circuits of said source of gain for supplying negative bias potential to said gain source grid input circuit and for maintaining the magnitude of the current through said crystal body at a substantially constant level.

5. Apparatus in accordance with claim 3, said frequency-adjusting reactance means constituting means adjusting said operating frequency with respect to said resonant frequency of said crystal body sufficiently to counteract and thereby approximately cancel the decrease in action in said crystal body caused by said resistor.

6. Crystal oscillator apparatus in accordance with claim 3, said frequency-adjusting reactance means comprising a capacitor.

7. Crystal oscillator apparatus in accordance with claim 3, said frequency-adjusting reactance means comprising an inductor.

8. Crystal oscillator apparatus in accordance with claim 3, said frequency-adjusting reactance means comprising a series-connected inductor and capacitor.

9. Crystal oscillator apparatus comprising an electronic source of gain having grid-cathode input and anode-cathode output circuits each comprising at least one capacitor, a feedback circuit for said source of gain comprising a series-connected inductor and frequency control means coupling said output circuit with said input circuit, said frequency control means comprising a series-resonant type overtone mode frequency piezoelectric crystal body and a frequency-adjusting reactor connected in series therewith, said feedback circuit inductor and said input and output circuit capacitors constituting a resonant circuit tuned substantially to said overtone mode frequency of said crystal body, and means comprising an ungrounded continuously-conductive resistor connected directly across in parallel circuit relation with said frequency control means and having a resistance value sufficiently large with respect to the operating frequency series-resonant resistance of said frequency control means for permitting desired oscillations substantially at said desired operating overtone mode frequency of said crystal body while simultaneously having a resistance value sufficiently small for effectively suppressing spurious oscillations at other mode frequencies of said crystal body lower in frequency than said operating frequency and for thereby rendering said crystal oscillator apparatus substantially non-oscillatory at said other mode undesired frequencies of said crystal body.

References Cited in the file of this patent

UNITED STATES PATENTS

| | | |
|---|---|---|
| 2,012,497 | Clapp | Aug. 27, 1935 |
| 2,444,349 | Harrison | June 29, 1948 |
| 2,575,363 | Simons | Nov. 20, 1951 |

FOREIGN PATENTS

| | | |
|---|---|---|
| 907,994 | France | Mar. 26, 1946 |